US012619395B2

(12) United States Patent
　Kim et al.

(10) Patent No.:　US 12,619,395 B2
(45) Date of Patent:　　May 5, 2026

(54) MEMORY DEVICE INCLUDING TERNARY MEMORY CELL

(71) Applicant: UNIST(ULSAN NATIONAL INSTITUTE OF SCIENCE AND TECHNOLOGY), Ulsan (KR)

(72) Inventors: Kyung Rok Kim, Ulsan (KR); Jae Won Jeong, Ulsan (KR); Youngeun Choi, Ulsan (KR); Wooseok Kim, Ulsan (KR); Myoung Kim, Ulsan (KR)

(73) Assignee: UNIST (ULSAN NATIONAL INSTITUTE OF SCIENCE AND TECHNOLOGY) (KR)

( * ) Notice: Subject to any disclaimer, the term of this patent is extended or adjusted under 35 U.S.C. 154(b) by 1117 days.

(21) Appl. No.: 17/672,650

(22) Filed: Feb. 15, 2022

(65) Prior Publication Data

US 2022/0413800 A1　　Dec. 29, 2022

(30) Foreign Application Priority Data

Jun. 28, 2021　　(KR) ........................ 10-2021-0084149

(51) Int. Cl.
　*G06F 7/544*　　　(2006.01)
　*G11C 11/412*　　(2006.01)
(52) U.S. Cl.
　CPC .......... *G06F 7/5443* (2013.01); *G11C 11/412* (2013.01); *Y02D 10/00* (2018.01)
(58) Field of Classification Search
　CPC ... G06F 7/5443; G11C 11/412; G11C 11/417; G11C 11/419; G11C 7/1006
　See application file for complete search history.

(56) References Cited

U.S. PATENT DOCUMENTS

| | | | |
|---|---|---|---|
| 6,747,885 B2* | 6/2004 | Park ....................... | G11C 15/04 |
| | | | 365/168 |
| 6,888,202 B2 | 5/2005 | Kang et al. | |

(Continued)

FOREIGN PATENT DOCUMENTS

| | | |
|---|---|---|
| KR | 100964266 B1 | 6/2010 |
| KR | 101956984 B1 | 3/2019 |

(Continued)

OTHER PUBLICATIONS

Wikipedia NPL: "Balanced ternary" (https://en.wikipedia.org/w/index.php?title=Balanced_ternary&oldid=1023501759) (Year: 2021).*

(Continued)

*Primary Examiner* — Andrew Caldwell
*Assistant Examiner* — Carlos Heberto De La Garza
(74) *Attorney, Agent, or Firm* — Klarquist Sparkman, LLP

(57) ABSTRACT

Provided is a memory device for a logic-in-memory. The memory cell includes: a ternary memory cell for storing ternary data: and a weight cell for controlling a current flowing in an operation line on the basis of a weight signal transmitted from the ternary memory cell and an activation signal transmitted via an activation line, wherein the weight cell includes a first transistor for receiving an input of weight data from a first node corresponding to a stored value of the ternary memory cell, a second transistor for receiving an input of inversed weight data from a second node corresponding to an inversed stored value of the ternary memory cell, and a third transistor for receiving an input of an activation signal transmitted via the activation line.

10 Claims, 7 Drawing Sheets

(56) References Cited

U.S. PATENT DOCUMENTS

| | | | |
|---|---|---|---|
| 10,050,042 B2 | 8/2018 | Chen et al. | |
| 2020/0257501 A1* | 8/2020 | Yabuuchi | G06N 3/065 |
| 2021/0089272 A1* | 3/2021 | Jain | G11C 7/1006 |

FOREIGN PATENT DOCUMENTS

| | | | |
|---|---|---|---|
| KR | 20200086144 A | 7/2020 | |
| KR | 20200129466 A | 11/2020 | |
| WO | WO-2020139895 A1 * | 7/2020 | G11C 15/04 |

OTHER PUBLICATIONS

Frieder, G. NPL: "Algorithms for Binary Coded Balanced and Ordinary Ternary Operations" (https://ieeexplore.ieee.org/stamp/stamp.jsp?tp=&arnumber=1672781) (Year: 1975).*

Jain, S. et al., "TIM-DNN: Ternary In-Memory Accelerator for Deep Neural Networks," *IEEE Transactions On Very Large Scale Integration (VLSI) Systems,* 28(7):1567-1577 (Jul. 2020).

Okumura, S. et al., "A Ternary Based Bit Scalable, 8.80 TOPS/W CNN accelerator with Many-core Processing-in-memory Architecture with 896K synapses/mm$^2$," 2019 *Symposium on VLSI Circuits Digest of Technical Papers,* pp. C248-C249 (Jul. 2019).

Si, X. et al., "A Twin-8T SRAM Computation-in-Memory Unit-Macro for Multibit CNN-Based AI Edge Processors," *IEEE Journal of Solid-State Circuits,* 55(1):189-202 (Jan. 2020).

Jiang et al., "C3SRAM: In-Memory-Computing SRAM macro based on capacitive- coupling computing," *IEEE Solid-State Circuits Letters* 2(9): 131-134, Sep. 2019.

Okumura et al., "A ternary based bit scalable, 8.80 TOPS/W CNN accelerator with many-core processing-in-memory architecture with 896K synapses/mm 2," In *2019 Symposium on VLSI Circuits,* pp. C248-C249. IEEE, Jun. 2019,.

* cited by examiner

MEMORY DEVICE INCLUDING TERNARY MEMORY CELL

CROSS-REFERENCE TO RELATED APPLICATION

This application is based on and claims priority under 35 U.S.C. § 119 to Korean Patent Application No. 10-2021-0084149, filed on Jun. 28, 2021, in the Korean Intellectual Property Office, the disclosure of which is incorporated by reference herein in its entirety.

BACKGROUND

1. Field

The disclosure relates to a memory device including a ternary memory cell, and more particularly, to a ternary weight cell circuit design method in a memory device using T-CMOS.

2. Description of the Related Art

In the case of devices that process a large amount of data, such as artificial intelligence, power consumption in a data processing process is very high. To solve a power consumption problem generated in artificial intelligence, recently, ultracompact AI technology such as Internet of things (IoT) and a mobile edge end has been developed.

In order to implement the ultracompact AI technology, it is required to maximize high computational efficiency with low power in a limited memory area. To maximize the computational efficiency, an AI computation accelerator that performs high-performance, high-efficiency information processing through parallel computation of large-capacity weight activation data based on a multiply and accumulate (MAC) operation is used.

According to the related art, an AI computation accelerator circuit includes a weight cell array for storing weights, which are learning information, and a binary complementary metal oxide semiconductor (CMOS)-based memory cell is used to secure area efficiency and an information transmission speed. The computation method by processing such binary weight information has caused a decrease in energy efficiency due to lowering of accuracy of a computation value and an unnecessary computation operation. To improve the above problems, a technology that changes a digital method from binary to ternary recently draws attention.

While a static random access memory (SRAM) cell according to a digital method according to the relates art is capable of storing information of 0 or 1, a ternary memory cell (ternary static random access memory) is capable of storing ternary information in 0, 1, 2 (or 0, 1/2, 1) in one memory cell, thereby implementing a storing capacity of 1.5 times for the same size. In contrast to the general binary logic circuit, such a ternary logic circuit can provide an advantage of processing a large amount of information, and may also be advantageous in a logic-in-memory structure that outputs a value obtained through logic operation of stored data.

However, to store ternary information, a memory cell has to be designed using two memory cells, and thus, there is a problem in that the area is rather doubled or more increased. Furthermore, the methods have a problem in that a lot of standby power is consumed due to an increase in leakage current according to the improvement of a CMOS density.

Recently, technology to reduce power consumption while maintaining area efficiency of a memory device has been developed.

SUMMARY

Provided are a ternary memory cell for calculating logic values stored in a memory cell by using a ternary logic circuit and outputting the calculated logic values, and a memory device including the same.

Furthermore, provided are a device and a method for increasing an energy efficiency and area efficiency of a memory device circuit design by storing information at a low current through a T-CMOS-based ternary weight cell circuit design.

Provided are a device and a method for reducing power consumption of a memory device by storing information at a low current through a T-CMOS-based ternary weight cell circuit design.

Additional aspects will be set forth in part in the description which follows and, in part, will be apparent from the description, or may be learned by practice of the presented embodiments of the disclosure.

According to an aspect of the disclosure, a memory cell in a memory device for a logic-in-memory includes a ternary memory cell for storing ternary data, and a weight cell for controlling a current flowing in an operation line on the basis of a weight signal transmitted from the ternary memory cell and an activation signal transmitted via an activation line, wherein the weight cell includes a first transistor for receiving an input of weight data from a first node corresponding to a stored value of the ternary memory cell, a second transistor for receiving an input of inversed weight data from a second node corresponding to an inversed stored value of the ternary memory cell, and a third transistor for receiving an input of an activation signal transmitted via the activation line.

According to another embodiment, the first transistor may be connected to the first node, the second transistor, and a first operation line, the second transistor may be connected to the second node, the first transistor, and a second operation line, and the third transistor may be connected to a third node that is a junction of the first transistor and the second transistor, and to the activation line.

According to another embodiment, the ternary memory cell may receive the weight data via a first bit line, receive the inversed weight data via a second bit line, and output the weight data and the inversed weight data as the weight cell on the basis of an input signal via a word line.

According to another embodiment, the weight cell may receive the weight data and the inversed weight data from the ternary memory cell, receive the activation signal to activate the weight cell via the activation line, and block at least one of a first current path along the first operation line and the first transistor or a second current path along the second operation line and the second transistor, on the basis of the weight data and the inversed weight data.

According to another embodiment, the number of transistors included in the weight cell may be three, and the number of transistors included in the memory cell may be nine.

According to an embodiment of the disclosure, a memory device for a logic-in-memory includes a memory cell array in which a plurality of memory cells are arranged, the plurality of memory cells including a ternary memory cell and a weight cell, a decoder connected to the memory cell array via at least one word line and selecting at least one of the plurality of memory cells, and a read and write circuit connected to the memory cell array via a plurality of bit lines and performing data latch, wherein the weight cell controls a current flowing in an operation line on the basis of a weight signal transmitted from the ternary memory cell and an activation signal transmitted via an activation line, and the weight cell includes a first transistor for receiving an input of weight data from a first node corresponding to a stored value of the ternary memory cell, a second transistor for receiving an input of inversed weight data from a second node corresponding to an inversed stored value of the ternary memory cell, and a third transistor for receiving an input of an activation signal transmitted via the activation line.

According to another embodiment, the first transistor may be connected to the first node, the second transistor, and a first operation line, the second transistor may be connected to the second node, the first transistor, and a second operation line, and the third transistor may be connected to a third node that is a junction of the first transistor and the second transistor, and to the activation line.

According to another embodiment, the weight cell may receive the weight data and the inversed weight data from the ternary memory cell, receive the activation signal to activate the weight cell via the activation line, and block at least one of a first current path along the first operation line and the first transistor or a second current path along the second operation line and the second transistor, on the basis of the weight data and the inversed weight data.

According to another embodiment, the plurality of memory cells may be connected in parallel between the first operation line and the second operation line, and a multiply and accumulate (MAC) operation may be performed on the basis of a difference between a voltage applied to the first operation line and a voltage applied to the second operation line.

Various respective aspects and features of the present invention are defined in the appended claims, Combinations of the characteristics of dependent claims can be appropriately combined with the characteristics of independent claims, not just explicitly presented in the claims.

Furthermore, one or more characteristics selected from any one embodiment described in the disclosure may be combined with one or more characteristics selected from other embodiments described in the disclosure, and an alternative combination of the characteristics may at least partially reduce one or more technical problems discussed in the disclosure, or technical problems discernable by a typical technician from the disclosure, and furthermore, a particular combination or permutation of embodiment features is possible unless understood by the typical technician as being incompatible.

In any described example implementation described in the disclosure, two or more physically separate constituent elements may be alternatively integrated into a single constituent element, if the integration is possible, and when the same function is performed by the single constituent element, the integration is possible. Reversely, the single constituent element of any embodiment described in the disclosure; may be alternatively implemented, if appropriate, as two or more separate constituent elements performing the same function.

The purpose of certain embodiments of the present invention is to at least partially solve, reduce, or remove at least one of problems and/or disadvantages related to the related art. Certain embodiments are to provide at least one of the advantages described below.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
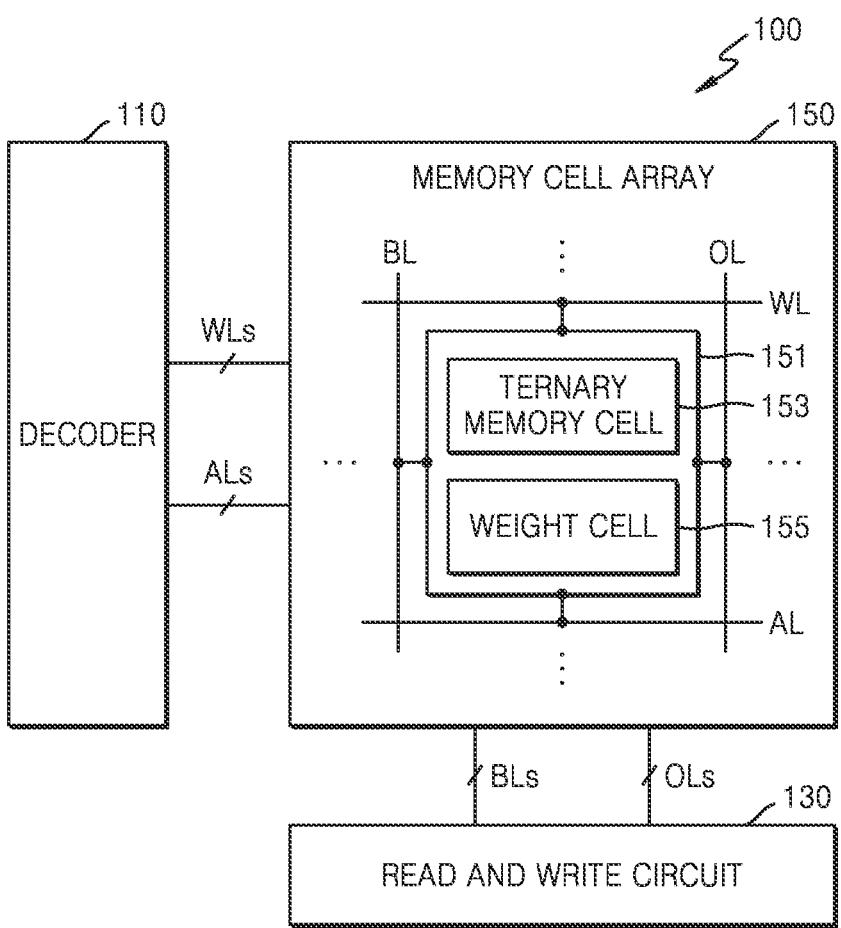
FIG. 1 is a block diagram of a memory device according to various embodiments of the disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and: or" includes any and all combinations of one or more of the associated listed items. Expressions such as "at least one of," when preceding a list of elements, modify the entire list of elements and do not modify the individual elements of the list.

The terms used in the specification are merely used to describe particular embodiments, and are not intended to limit the disclosure. An expression used in the singular encompasses the expression of the plural, unless it has a clearly different meaning in the context. Unless otherwise defined, all terms (including technical and scientific terms) used herein have the same meaning as commonly understood by one of ordinary skill in the art to which embodiments belong. The terms as those defined in generally used dictionaries are construed to have meanings matching that in the context of related technology and, unless clearly defined otherwise, are not construed to be ideally or excessively formal. In some cases, even a term defined in the disclosure cannot be construed to exclude embodiments of the disclosure.

In various embodiments of the disclosure described below, a hardware-based approach method is described as an example. However, since various embodiments of the disclosure include technology that uses both hardware and software, various embodiments of the disclosure do not exclude software-based access methods.

Hereinafter, the disclosure relates to a memory device based on a ternary memory cell. In detail, the disclosure discloses a technology to increase area efficiency and reduce power consumption of memory devices through a T-CMOS-based weight cell circuit design in ternary memory cell-based memory devices.

Hereinafter, various embodiments of the disclosure will be described with reference to the accompanying drawings so that a person skilled in the art to which the disclosure belongs can easily work. However, the present embodiments may be implemented in various forms, not by being limited to the embodiments presented below. In the description of the disclosure, certain detailed explanations of related art are omitted when it is deemed that they may unnecessarily obscure the essence of the disclosure. In the drawings, similar reference numerals denote the same or similar elements in various aspects, and any redundant description thereof is omitted.

Furthermore, in the specification, when a constituent element "connects" or is "connected" to another constituent element, the constituent element contacts or is connected to the other constituent element not only directly, but also electrically through at least one of other constituent elements interposed therebetween. Also, when a part may "include" a certain constituent element, unless specified otherwise, it may not be construed to exclude another constituent element but may be construed to further include other constituent elements.

The disclosure may be described in terms of functional block components and various processing steps. Such functional blocks may be realized by any number of hardware and/or software components configured to perform the specified functions. For example, the disclosure may employ various integrated circuit components for a certain function. The functional blocks of the disclosure may be implemented with any programming or scripting language. The functional blocks of the disclosure may be implemented with an algorithm executed on one or more processors. A function performed by a functional block in the disclosure may be performed by a plurality of functional blocks, or functions performed by a plurality of functional blocks in the disclosure may be performed by one functional block. Furthermore, the disclosure may employ related-art technologies for electronic environment settings, signal processing, data processing, and/or the like.

Furthermore, in the disclosure, in order to determine whether a specific condition is satisfied or fulfilled, an expression of "exceeding" or "less than" is used, but this is only a description to express an example or does not exclude the description of "more than or equal to" or "less than or equal to". Conditions described as "more than or equal to" can be replaced with "exceeding," "less than" for conditions described as "less than or equal to", and conditions described as "more than or equal to and less than" can be replaced with "exceeding and less than or equal to."

FIG. 1 is a block diagram of a memory device 100 according to various embodiments of the disclosure. In detail, FIG. 1 is a block diagram showing a connection relationship of the memory device 100 including a ternary memory cell 153.

Referring to FIG. 1, the memory device 100 may include a decoder 110, a read and write circuit 130, and a memory cell array 150.

The decoder 110 performs a function of optionally controlling a plurality of word lines WLs in response to an operation mode command generated from a memory controller. The decoder 110 may be configured to select at least one memory cell of a plurality of memory cells. The decoder 110 may be connected to the memory cell array 150 via the word lines WLs and a plurality of activation lines ALs.

According to an embodiment of the disclosure, the decoder 110 may activate at least one of the word lines WLs when data is stored or read out with respect to a memory cell in a certain row of the memory cell array 150. According to an embodiment of the disclosure, the decoder 110 may activate at least one of the activation lines ALs to activate a weight cell in the memory cell array 150. FIG. 1 illustrates that the word lines WLs are distinguished from the activation lines ALs, but the activation lines ALs may be configured as examples of the word lines WLs.

The read and write circuit 130 may perform a function of latching write data or read-out data. The read and write circuit 130 may be connected to the memory cell array 150 via a plurality of bit lines BLs and a plurality of operation lines OLs. According to an embodiment of the disclosure, the read and write circuit 130 may include a sense amplification circuit, data input buffers, and data output buffers. FIG. 1 illustrates that the bit lines BLs are distinguished from the operation lines OLs, but the operation lines OLs may be configured as examples of the bit lines BLs.

The memory cell array 150 may include at least one memory cell 151. According to an embodiment of the disclosure, the memory cell array 150 may have a structure in which the at least one memory cell 151 including the ternary memory cell 153 and a weight cell 155 is arranged. The ternary memory cell 153 may store ternary logic values about weight data and output the stored weight data to the weight cell 155. Furthermore, the weight cell 155 may perform a function as a computation accelerator. In detail, the weight cell 155 may control a current path flowing from the operation line OL to the weight cell 155 on the basis of a value stored in the ternary memory cell 153 and an activation signal input via the activation lines ALs.

Furthermore, the memory cell 151 may have a logic-in-memory (LIM) structure.

The weight cell 155 may generate a control signal to control a current path flowing from the operation line OL to the weight cell 155, and determine an amount of a voltage applied to the operation line OL in response to the control signal. According to an embodiment of the disclosure, the weight cell 155 may be connected to at least one of the operation lines OLs connected to the read and write circuit 130 and at least one of the activation lines ALs connected to the decoder 110. When an activation signal is input via the activation line AL, the weight cell 155 may identify weight data transmitted from the bit line BL through the ternary memory cell 153, and block a flow of at least one of current flows formed by the operation lines OLs and the weight cell 155 on the basis of the weight data. The weight cell 155 may block the current flow to perform a function as a computation accelerator.

The memory cell array 150 may be connected to the decoder 110 via the word lines WLs, and to the read and write circuit 130 via the bit lines BLs. The memory cell 151 may be coupled to at least one of the word lines WLs and at least one of the bit lines BLs. Accordingly, the memory cell 151 may have a structure to store a ternary logic value provided via at least one bit line BL.

Figure 2:
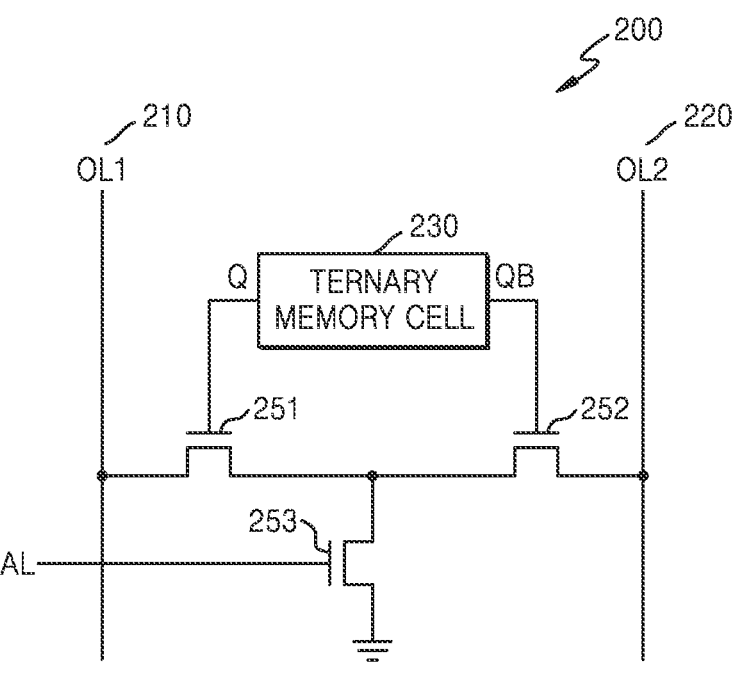
FIG. 2 is a circuit diagram schematically showing a configuration of a memory cell in a memory device, according to various embodiments of the disclosure.

FIG. 2 is a circuit diagram schematically showing a configuration of a memory cell 200 in a memory device, according to various embodiments of the disclosure. FIG. 2 shows an example of the configuration of the memory cell 151 of FIG. 1.

Referring to FIG. 2, the memory cell 151 may include a ternary memory cell 230 and first to third transistors 251 to 253.

The ternary memory cell 230 may indicate a memory cell capable of storing ternary logic values. The ternary memory cell 230 may receive a signal from the decoder 110 via at least one word line WL, and store a ternary logic value. According to an embodiment of the disclosure, the ternary memory cell 230 may include two access transistor and two inverters. According to an embodiment of the disclosure, the ternary memory cell 230 may indicate static random access memory (SRAM) including a ternary logic circuit or a ternary logic element, According to an embodiment of the disclosure, the ternary memory cell may be referred to as ternary SRAM or T-SRAM. The ternary logic values to be stored in the ternary memory cell 230 may be referred to as "0," "1," and "2". The ternary logic values may be data having any one voltage of a low voltage VL, a high voltage VH, and a middle voltage VM. In an example, the low voltage VL may be a ground voltage GND, the high voltage VH may be a driving voltage $V_{DD}$, and the middle voltage VM may be a half driving voltage $V_{DD}/2$. In the disclosure, the low voltage VL, the high voltage VH, and the middle voltage VM may be expressed as 0, 2, and 1, respectively.

The ternary memory cell 230 may receive the weight data by using the bit lines BLs connected between the read and write circuit 130 and the memory cell array 150, The ternary memory cell 230 may store the received weight data, and when a start signal is input via the word lines connecting between the decoder 110 and the memory cell array 150, and output the stored data to the first transistor 251 and the second transistor 252. In detail, the ternary memory cell 230 may output weight data Q to a gate of the first transistor 251, and output inversed weight data QB to a gate of the second transistor 252. The configuration and function of the ternary memory cell 230 are described in detail with reference to FIGS. 3 to 5.

The first to third transistors 251 to 253 may perform a function to determine a weight on the basis of the activation signal input via the activation lines ALs between the decoder 110 and the memory cell array 150, According to an embodiment of the disclosure, each of the gate of the first transistor 251 and the gate of the second transistor 252 is connected to output nodes of the ternary memory cell 230, and a gate of the third transistor 253 is connected to the activation line AL. When an activation signal is input to the third trans 253 via the activation line AL, at least one of a first current path along the first operation line OL1—the first transistor 251— the third transistor 253—the ground voltage GND or a second current path along the second operation line OL2— the second transistor 252—the third transistor 253—the ground voltage GND may be blocked. The first to third transistors 251 to 253 blocks at least one of the first and second current paths on the basis of the stored value of the ternary memory cell 230, and adjusts an amount of a voltage applied to the first operation line 210 and the second operation line 220, thereby performing a weight operation. The configuration and function of the first to third transistors 251 to 253 are described in detail with reference to FIGS. 3 and 6.

Figure 3:
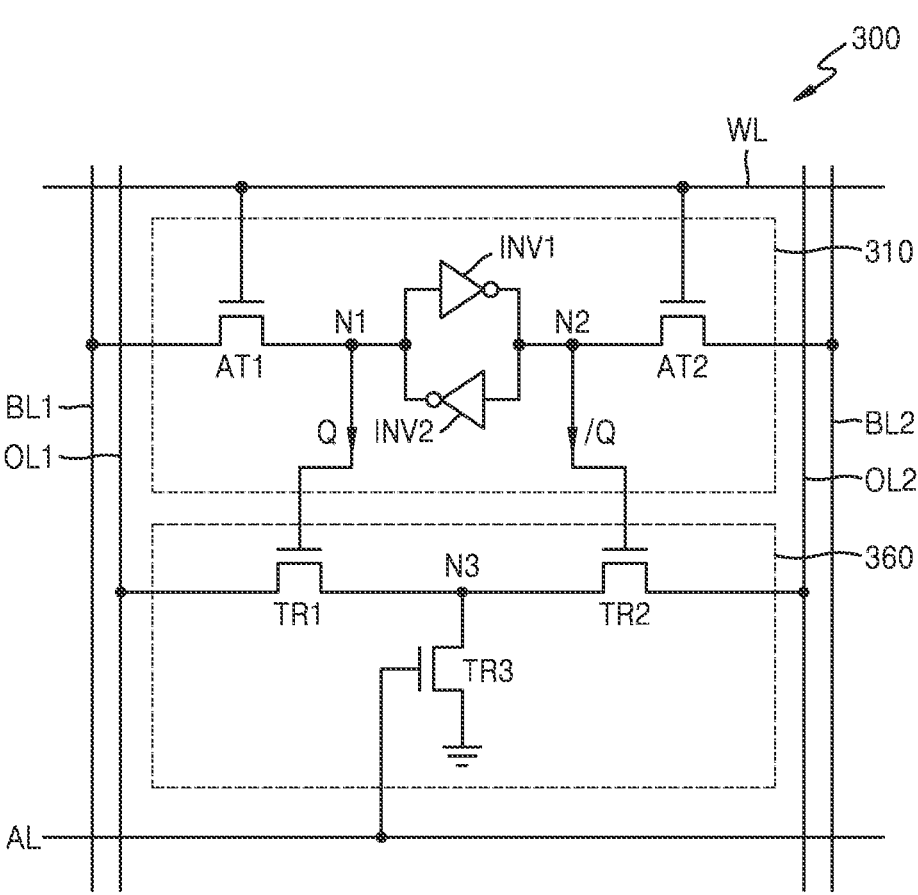
FIG. 3 is a circuit diagram of a memory cell in a memory device, according to various embodiments of the disclosure.

FIG. 3 is a circuit diagram 300 of a memory cell 151 in a memory device, according to various embodiments of the disclosure. FIG. 3 is a circuit diagram of a memory cell 151 including a total of nine transistor devices including three devices connected to the activation line AL and the first and second operation lines OL1 and OL2, in a T-CMOS-based T-SRAM (6T ternary SRAM) cell having the same area as a CMOS-based binary SRAM cell.

Referring to FIG. 3, the memory cell 151 may be connected to the word line WL and the activation line AL, to a first bit line BL1 and a second bit line BL2 as at least one bit line BL, and to the first operation line OL1 and the second operation line OL2 as at least one operation line. Furthermore, the memory cell 151 may store one logic value of ternary logic values, that is, 0/1/2.

Referring to FIG. 3, the memory cell 151 may include a ternary memory cell 310 and a weight cell 360. The ternary memory cell 310 may include a first inverter INV1, a second inverter INV2, a first access transistor AT1, and a second access transistor AT2, and the weight cell 360 may include first to third transistors TR1 to TR3.

Furthermore, when each of a first node N1 and a second node N2 has an intermediate voltage, for example, $V_{DD}/2$ or $(V_{DD}+V_{SS})/2$, the ternary memory cell 310 may be referred to as one that stores a logic value 1 (Q=1). Furthermore, when the first node N1 has the ground voltage GND or a negative supply voltage $V_{SS}$, and the second node N2 has a positive supply voltage $V_{DD}$, the ternary memory cell 310 may be referred to as one that stores a logic value 0 (Q=0).

The first access transistor AT1 may be connected to the first node N1 and the first bit line BL1, and may have a gate, or a control terminal, connected to the word line WL. The first access transistor AT1 may electrically connect or disconnect the first node N1 and the first bit line BL1, according to the voltage of the word line WL, For example, the first access transistor AT1 may be an N-channel field effect transistor (NFET), and may electrically connect the first node N1 and the first bit line BL1 to each other, in response to the voltage of the word line WL that is activated, that is, at a high level. The first access transistor AT1 may electrically disconnect the first node N1 and the first bit line BL1 from each other, in response to the voltage of the word line WL that is deactivated, that is, at a low level. The second access transistor AT2 may be connected to the second node N2 and the second bit line BL2, similarly to the first access transistor AT1, and may have a gate, or a control terminal, connected to the word line WL. The first access transistor AT1 and the second access transistor AT2 are described below as being assumed to be NFETs, and the embodiments of the present disclosure may be applied to a case in which the first access transistor AT1 and the second access transistor AT2 are P-channel field effect transistors (PFETs), transmission gates, and the like.

The weight cell 360 may perform a MAC operation function. The weight cell 360 may receive an input of an activation signal and control a current path on the basis of the weight data transmitted from the ternary memory cell 310, thereby generating a voltage difference between the first operation line OL1 and the second operation line OL2. The MAC operation may be performed in a process of reading out the voltage difference generated by the weight cell 360.

According to an embodiment of the disclosure, the weight cell 360 may be connected to the first node N1 and the second node N2, and to the activation line AL. Accordingly, the weight cell 360 may receive the value stored in the ternary memory cell 310 (hereinafter, referred to as the stored value) and an inversed stored value that is an inversed value of the stored value, and receive an activation signal via the activation line AL. The stored value and the inversed stored value may be referred to as the weight data and the inversed weight data, respectively.

According to an embodiment of the disclosure, the weight cell 360 may receive an activation signal to turn on the weight cell 360 from the activation line AL, and the weight data transmitted from the first bit line BL1 and the second bit line BL2 to the ternary memory cell 310, thereby controlling a flow of a current passing through the first operation line OL1 and the second operation line OL2.

According to an embodiment of the disclosure, the weight cell 360 may have a structure in which the first transistor TR1 for receiving the stored value of the ternary memory cell 310 and the second transistor TR2 for receiving the inversed stored value of the ternary memory cell 310 are connected to each other at a third node N3 that is a junction of the first transistor TR1 and the second transistor TR2. The first transistor TR1 may have a structure in which the first node N1 corresponding to the stored value of the ternary memory cell 310 and a gate thereof area connected to receive an input of the weight data Q. Likewise, the second transistor TR2 may have a structure in which the second node N2 corresponding to the inversed stored value of the ternary memory cell 310 and a gate thereof are connected to receive an input of an inversed stored value QB. The third transistor TR3 has a structure; in which the activation line AL is connected to a gate thereof to receive; an input of an activation signal.

In detail, in a circuit structure of the weight cell 360, the first transistor TR1 may be connected to the first node N1, the second transistor TR2, and the first operation line OL1, the second transistor TR2 may be connected to the second node N2, the first transistor TR1, and the second operation line OL2, and the third transistor TR3 may be connected to the third node N3 that is a junction of the first transistor TR1 and the second transistor TR2, and the activation line AL.

Accordingly, the ternary memory cell 310 may receive an input of the weight data via the first bit line BL1 and an input of the inversed weight data via the second bit line BL2, and output the weight data and the inversed weight data to the weight cell 360 in response to an input signal via the word line WL, and the weight cell 360 may store the weight data and the inversed weight data in response to the input signal via the word line WL.

Then, the weight cell 360 may block at least one of the first current path flowing along the first operation line OL1—the first transistor TR1—the third transistor TR3— the ground voltage GND or the second current path flowing along the second operation line OL2—the second transistor TR2—the third transistor TR3—the ground voltage GND, on the basis of the weight data. As the current path of the weight cell 360 is controlled, a difference in the voltage applied to the first operation line OL1 and the second operation line OL2 may be generated. As the weight cell array includes a plurality of weight cells, an MAC operation may be performed on the basis of a voltage difference generated between the respective weight cells. In other words, the read and write circuit 130 may perform an MAC operation by reading out the voltages accumulated via the first operation line OL1 and the second operation line OL2.

Figure 4:
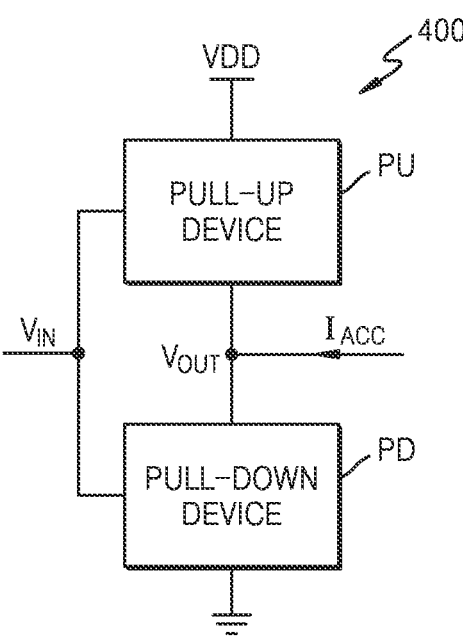
FIG. 4 is a block diagram of an inverter included in a ternary memory cell in a memory device, according to various embodiments of the disclosure.

According to the present disclosure, as the total number of transistors included in the ternary memory cell 310 is six and the number of transistors included in the weight cell 360 is three, the memory cell 151 may include a total of nine transistors. According to a memory device of the related art, two or more ternary memory cells are connected to one weight cell. Accordingly, the related-art memory device may include at least fifteen transistors including twelve transistors included in a ternary memory cell and three transistors included in a weight cell. In other words, by using fifteen transistors, the related-art memory device has low area efficiency and high power consumption. In contrast, a memory cell according to the disclosure may include one ternary memory cell and one weight cell. Accordingly, a memory cell according to the disclosure may include a total of nine transistors including six transistors included in a ternary memory cell and three transistor included in a weight cell. Accordingly, as the memory cell according to the disclosure stores ternary information on the basis of an off-level low current, very low standby power consumption and high area efficiency may be provided, FIG. 4 is a block diagram of an inverter 400 included in a ternary memory cell in a memory device, according to various embodiments of the disclosure. FIG. 4 shows an example of a pair of inverters included in the ternary memory cell 310 of FIG. 3. Each inverter may include elements configured to pass a constant current therethrough during turn-off.

The inverter performs a function of generating an output voltage $V_{OUT}$ by inversing an input voltage $V_{IN}$. Referring to FIG. 4, the inverter may include a pull-up device PU and a pull-down device PD that are serially connected to each other between a positive supply voltage $V_{DD}$ and the ground voltage GND (or a negative supply voltage $V_{SS}$). The pull-up device PU may be turned off in response to the input voltage $V_{IN}$ of a high level, for example, the positive supply voltage $V_{DD}$, and turned on in response to the input voltage $V_{IN}$ of a low level, for example, the ground voltage GND. In the other hand, the pull-down device PD may be turned off in response to the input voltage $V_{IN}$ of a low level, for example, the ground voltage GND, and turned on in response to the input voltage $V_{IN}$ of a high level, for example, the positive supply voltage $V_{DD}$. Accordingly, similar to a binary logic circuit, the output voltage $V_{OUT}$ of a low level, for example, GND may be output in response to the input voltage $V_{IN}$ of a high level, for example, $V_{DD}$, and the output voltage $V_{OUT}$ of a high level, for example, $V_{DD}$ may be output in response to the input voltage $V_{IN}$ of a low level, for example, GND.

The pull-up device PU and the pull-down device PD may pass a constant current therethrough during turn-off. In other words, a through current $I_{TF}$ of the pull-up device PU may be constant when the pull-up device PU is turned off, and a through current $I_{TN}$ of the pull-down device PD may also be constant when the pull-down device PD is turned off. Furthermore, according to an embodiment of the disclosure, a threshold voltage of the pull-up device PU may be the same as a threshold voltage of the pull-down device PD. According to another embodiment of the disclosure, the threshold voltage of any one of the pull-up device PU and the pull-down device PD may be less than the threshold voltage of the other one. In an example, the threshold voltage of the pull-down device PD may be less than the threshold voltage of the pull-up device PU. Accordingly, when the input voltage $V_{IN}$ gradually increases from the ground voltage GND to the positive supply voltage $V_{DD}$ the pull-down device PD may be turned on after the pull-up device PU is turned off. Accordingly, like the input voltage $V_{IN}$—the output voltage $V_{OUT}$ characteristics of FIG. 5, both of the pull-up device PU and the pull-down device PD may be tuned off between about 0.6 V and about 1.1 V.

Figure 5:
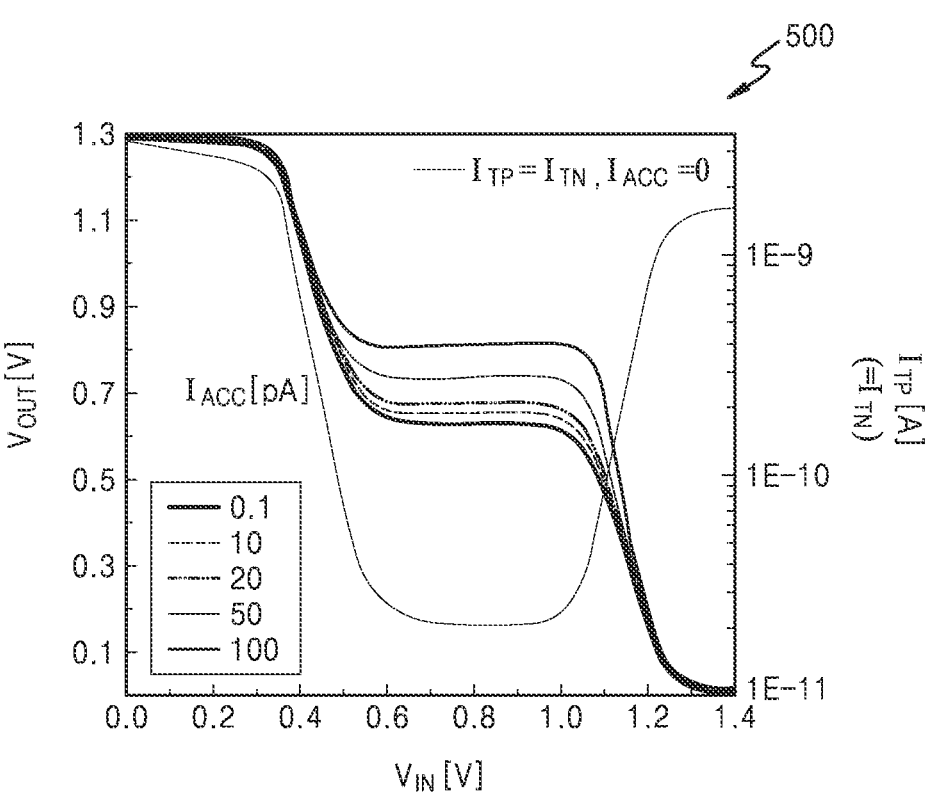
FIG. 5 is a graph showing an operation of an inverter included in a ternary memory cell in a memory device, according to various embodiments of the disclosure.

FIG. 5 is a graph showing an operation of an inverter included in a ternary memory cell in a memory device, according to various embodiments of the disclosure. A graph 500 of FIG. 5 shows an example of an operation of an inverter regarding the input voltage $V_{IN}$—the output voltage $V_{OUT}$ characteristics and the input voltage $V_{IN}$—the through currents $I_{TP}$ and $I_{TN}$ characteristics. In the graph 500 of FIG. 5, the horizontal axis denotes the input voltage $V_{IN}$, the left vertical axis denotes the output voltage $V_{OUT}$, and the right vertical axis denotes the through currents $I_{TP}$ and $I_{TN}$ in a log scale. In the graph 500 of FIG. 5, the figures marked on the horizontal axis and the vertical axes are mere examples when the positive supply voltage $V_{DD}$ is 1.4 V, and may vary according to the characteristics of a device.

Referring to FIG. 5, when there is no current $I_{ACC}$ applied to an output end of the inverter, the through current $I_{TP}$ of the pull-up device PU and the through current $I_{TN}$ of the pull-down device PD may have the same amount, and the through currents $I_{TP}$ and $I_{TN}$ may be maintained constant at a low level between about 0.6 V and about 1.1 V. As a result, the output voltage $V_{OUT}$ may be maintained substantially constant between about 0.6 V and about 1.1 V due to the through current $I_{TP}$ of the pull-up device PU and the through current $I_{TN}$ of the pull-down device PD, In other words, when the input voltage $V_{IN}$ of an intermediate level, for example, about half $V_{DD}/2$ of the positive supply voltage $V_{DD}$, is provided, the inverter may output the output voltage $V_{OUT}$ of an intermediate level, for example, about half $V_{DD}/2$ of the positive supply voltage $V_{DD}$. Accordingly, when the ground voltage GND, the intermediate voltage $V_{DD}/2$, and the positive supply voltage $V_{DD}$, which respectively correspond to 0/1/2 logic values, are input, the inverter may output the positive supply voltage $V_{DD}$, the intermediate voltage $V_{DD}/2$, and the ground voltage GND, which respectively correspond to 2/1/0 logic values. In the specification, the "intermediate voltage" is assumed to be the half $V_{DD}/2$ of the positive supply voltage $V_{DD}$, it would be understood that the intermediate voltage is a voltage of a certain level between the positive supply voltage $V_{DD}$ and the ground voltage GND.

For SRAM including cross-coupled two inverters, a characteristic of not changing a value stored in a memory cell during a read-out operation, for example, a high read-out static noise margin (SNM), may be needed. Referring to FIG. 5, the inverter of FIG. 4 may provide a high read-out SNM even when the access current $I_{ACC}$ increases, for example, the access current lace is higher than the through currents $I_{TP}$ and $I_{TN}$.

Figure 6:
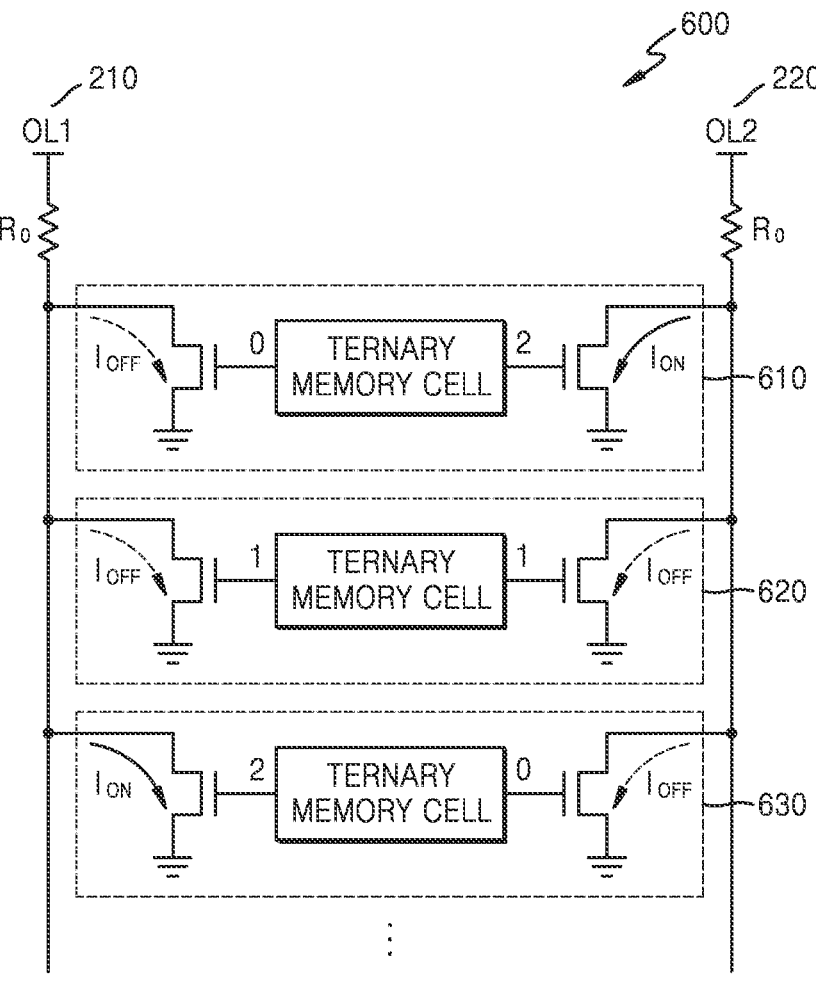
FIG. 6 is a schematic view showing a method of operating a memory cell array in a memory device, according to various embodiments of the disclosure.

FIG. 6 is a schematic view showing a method 600 of operating a memory cell array in a memory device, according to various embodiments of the disclosure.

FIG. 6 shows an example in which a resistance $R_0$ is connected to each of the first operation line OL1 and the second operation line OL2, and a plurality of memory cells, that is, first to third memory cells 610, 620, and 630, are connected in parallel. Each of a plurality of memory cells may include a ternary memory cell and a weight cell, and in FIG. 6, a transistor connected to a left output of the ternary memory cell may indicate a first transistor of the weight cell, and a transistor connected to a right output of the ternary memory cell may indicate a second transistor of the weight cell. Although a third transistor is not illustrated in FIG. 6, the third transistor may be connected to a junction of the first transistor and the second transistor. Furthermore, FIG. 6 shows an example in which the memory cell array includes three memory cells, but the number of memory cells is not limited to the illustration of FIG. 6.

Referring to FIG. 6, the first memory cell 610 may output weight data 0 through the first node N1 (Q=0), and output weight data 2 through the second node N2 (QB=2). In this case, the weight cell may identify a weight value W as −1, and may block a flow of a first current path from the first operation line 210 to the first transistor. Reversely, the weight cell may operate such that a current flows in a second current path from the second operation line 220 to the second transistor. Accordingly, voltages applied to the first operation line 210 and the second operation line 220 may be different from each other.

In the same method, the second memory cell 620 may output weight data 1 through the first node N1 (Q=1), and output weight data 1 through the second node N2 (QB=1). In this case, the weight cell may identify the weight value W as 0, and may block a flow of the first current path from the first operation line 210 to the first transistor and a flow of the second current path from the second operation line 220 to the second transistor.

In the same method, the third memory cell 630 may output weight data 2 through the first node N1 (Q=2), and output weight data 0 through the second node N2 (QB=0). In this case, the weight cell may identify the weight value W as +1, and block a flow of the second current path from the second operation line 220 to the second transistor. Reversely, the weight cell may operate such that a current flows in the first current path from the first operation line 210 to the first transistor. Accordingly, voltages applied to the first operation line 210 and the second operation line 220 may be different from each other.

In the same method, a weight operation may be performed on each of the first to third memory cells 610, 620, and 630 connected to the first operation line 210 and the second operation line 220. The voltage applied to each of the first operation fine 210 and the second operation line 220 may be determined by each of the first to third memory cells 610, 620, and 630 as in Equation 1.

$$V_{OL1} = V_{DD}\left(1 + \frac{R_0 N_p I_{on}}{V_{DD}}\right)^{-1} V_{OL2} = \qquad \text{[Equation 1]}$$

$$V_{DD}\left(1 + \frac{R_0 N_n I_{on}}{V_{DD}}\right)^{-1} << mth2 >>$$

Referring to Equation 1, $V_{OL1}$ may denote a voltage applied to the first operation line OL1, $V_{OL2}$ may denote a voltage applied to the second operation line OL2, R0 may denote the amount of resistance, Np may denote the number of memory cells having a weight value of −1, Nn may denote the number of memory cells having a weight value of +1, $I_{on}$ may denote a current flowing through the first current path or the second current path, and $V_{DD}$ may denote a supply voltage.

As expressed in Equation 1, as the weight cell controls the flow of the first current path or the second current path, a difference in voltage applied via the first operation line OL1 and the second operation line OL2 may be generated on the basis of the number of memory cells having a specific weight value. The read and write circuit 130 reads out a voltage difference via the first operation line OL1 and the second operation line OL2, so that an MAC operation may be performed.

The weight cell according to the disclosure controls a flow of a current path by receiving inputs of an activation signal and a weight signal, thereby changing a voltage applied to the operation line. The input and output of the weight cell may be summarized and shown in Table 1.

TABLE 1

| Input | | Output | |
|---|---|---|---|
| Activation line | Weight value | First operation line | Second operation line |
| 2 | −1 | $V_{DD}$ | $V_{DD} - \Delta$ |
| 2 | 0 | $V_{DD}$ | $V_{DD}$ |
| 2 | +1 | $V_{DD} - \Delta$ | $V_{DD}$ |

TABLE 1-continued

| Input | | Output | |
|---|---|---|---|
| Activation line | Weight value | First operation line | Second operation line |
| 0 | −1 | $V_{DD}$ | $V_{DD}$ |
| 0 | 0 | $V_{DD}$ | $V_{DD}$ |
| 0 | +1 | $V_{DD}$ | $V_{DD}$ |

Referring to Table 1, the weight cell receives an input of an activation signal 2 via the activation line AL, and control the flow of a current path according to the weight data. In Table 1, when a weight value is −1, the weight data of the ternary memory cell is 0(Q=0) and the inversed weight data is 2 (QB=2), when a weight value is 0, the weight data of the ternary memory cell is 1 (Q=1), and the inversed weight data is 1 (QB=1), and when a weight value is −1, the weight data of the ternary memory cell is 2 (Q=2), and the inversed weight data is 0 (QB=0).

The weight cell may receive an input of an activation signal via the activation line AL, and identify the weight value to generate a difference in voltage applied to the first operation line OL1 and the second operation line OL2. The weight cell array including a plurality of weight cells may accumulate voltage differences according to each of the weight cells, and perform a function as a configuration of an MAC operator.

Figure 7:
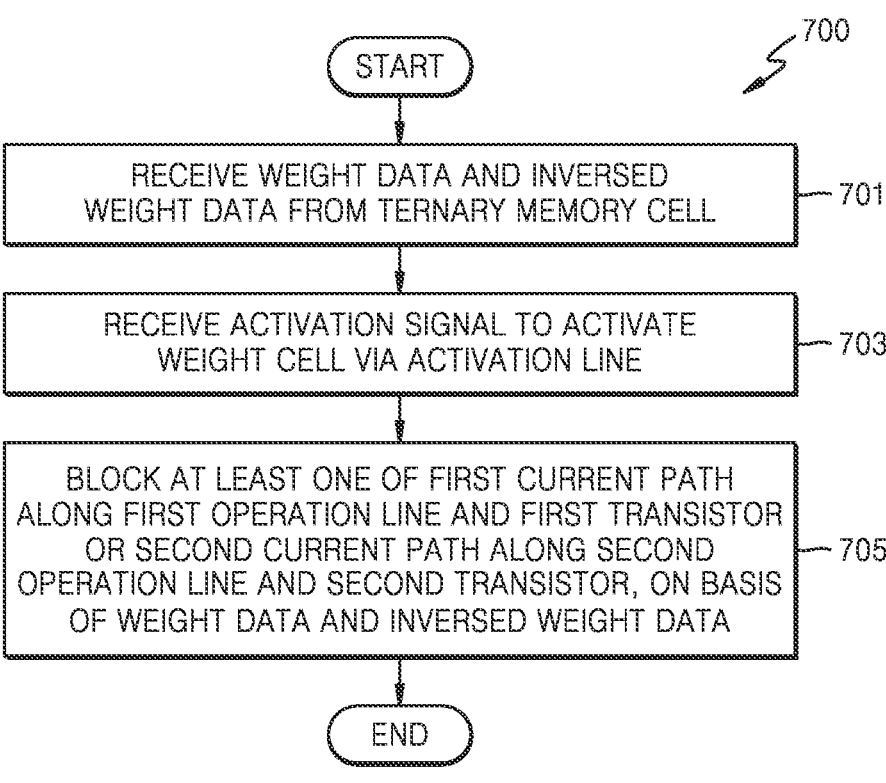
FIG. 7 is a flowchart showing a method of operating a weight cell included in a memory cell in a memory device, according to various embodiments of the disclosure.

FIG. 7 is a flowchart showing a method 700 of operating a weight cell included in a memory cell in a memory device, according to various embodiments of the disclosure.

Referring to FIG. 7, in operation 701, the weight cell 360 receives weight data and inversed weight data from a ternary memory cell. The ternary memory cell may output a stored value to the weight cell on the basis of an input signal from a word line. The ternary memory cell may output the weight data and the inversed weight data to the weight cell 360 via the first node N1 and the second node N2 of the ternary memory cell. The gate of the first transistor TR1 of the weight cell 360 may be connected to the first node N1 and the gate of the second transistor TR2 may be connected to the second node N2. In response thereto, the weight cell 360 may store the weight data and the inversed weight data by using the first transistor TR1 and the second transistor TR2. According to an embodiment of the disclosure, the ternary memory cell outputs the weight data stored in the weight cell in response to an input signal from a word line, and in response thereto, the weight cell 360 may store the weight data and the inversed weight data on the basis of the input signal of the word line.

In operation 703, the weight cell 360 may receive an activation signal to activate the weight cell via the activation line. The weight cell 360 may receive an input of the activation signal to activate the weight cell via the activation line connected between the decoder and the memory cell array. According to an embodiment of the disclosure, a signal of a $2V_{DD}$ voltage or a $V_{DD}$ voltage may be used as the activation signal. The weight cell 360, in response to the received activation signal, may perform an operation of the weight cell.

In operation 705, the weight cell 360 may block at least one of a first current path along the first operation line and the first transistor TR1 or a second current path along the second operation line and the second transistor TR2, on the basis of the weight data and the inversed weight data. The weight cell 360 may identify a weight value on the basis of the weight data and the inversed weight data, and control a flow of a current on the basis of the weight value. As the weight cell 360 blocks at least one of the first current path or the second current path, a difference may be generated in the voltages applied to the first operation line and the second operation line. The weight cell 360 may generate a voltage difference between the first operation line and the second operation line, and then an MAC operation may be performed in a process in which the read and write circuit 130 reads out the voltage difference.

According to the device and method according to various embodiments of the disclosure, in the memory device based on the ternary memory cell, through a weight circuit design based on a T-CMOS, the performance of an AI computation accelerator may be improved.

According to the device and method according to various embodiments of the disclosure, in the memory device based on the ternary memory cell, through a weight circuit design based on a T-CMOS, the energy efficiency and area efficiency of a memory device may be increased.

According to the device and method according to various embodiments of the disclosure, in the memory device based on the ternary memory cell, through a weight circuit design based on a T-CMOS, the power consumption of a memory device may be reduced.

The effects of the present disclosure are not limited to the above-described effects, and other various effects that are not described in the specification may be clearly understood from the following descriptions by one skilled in the art to which the present disclosure belongs.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A memory cell in a memory device for a logic-in-memory, the memory cell comprising:

a single ternary memory cell configured to store ternary data having a weight value of one of −1, 0 and +1; and a weight cell configured to control a current flowing in an operation line on a basis of a weight signal transmitted from the ternary memory cell and an activation signal transmitted via an activation line, wherein the weight cell comprises a first transistor for receiving an input of weight data from a first node corresponding to a stored value of the ternary memory cell, a second transistor for receiving an input of inversed weight data from a second node corresponding to an inversed stored value of the ternary memory cell, and a third transistor for receiving an input of an activation signal transmitted via the activation line, wherein when the ternary memory cell stores the weight value of −1, the weight data of the first node is 0 and the inversed weight data of the second node is 2, when the ternary memory cell stores the weight value of 0, the weight data of the first node and the inversed weight data of the second node are 1, and when the ternary memory cell stores the weight value of +1, the weight data of the first node is 2 and the inversed weight data of the second node is 0.

2. The memory cell of claim 1, wherein the first transistor is connected to the first node, the second transistor, and a first operation line, the second transistor is connected to the second node, the first transistor, and a second operation line, and the third transistor is connected to a third node that is a junction of the first transistor and the second transistor, and to the activation line.

3. The memory cell of claim 2, wherein the ternary memory cell is configured to:

receive the weight data via a first bit line;

receive the inversed weight data via a second bit line; and output the weight data and the inversed weight data as the weight cell on a basis of an input signal via a word line.

4. The memory cell of claim 2, wherein the weight cell is configured to:

receive the weight data and the inversed weight data from the ternary memory cell;

receive the activation signal to activate the weight cell via the activation line; and block at least one of a first current path along the first operation line and the first transistor or a second current path along the second operation line and the second transistor, on a basis of the weight data and the inversed weight data.

5. The memory cell of claim 1, wherein the memory cell comprises one ternary memory cell and one weight cell.

6. The memory cell of claim 1, wherein a number of transistors included in the weight cell is three, and a number of transistors included in the memory cell is nine.

7. A memory device for a logic-in-memory, the memory device comprising:

a memory cell array in which a plurality of memory cells are arranged, each of the plurality of memory cells comprising a single ternary memory cell configured to store ternary data having a weight value of one of −1, 0 and +1 and a weight cell;

a decoder connected to the memory cell array via at least one word line and configured to select at least one of the plurality of memory cells; and a read and write circuit connected to the memory cell array via a plurality of bit lines and configured to perform data latch, wherein the weight cell is configured to control a current flowing in an operation line on a basis of a weight signal transmitted from the ternary memory cell and an activation signal transmitted via an activation line, and the weight cell comprises a first transistor for receiving an input of weight data from a first node corresponding to a stored value of the ternary memory cell, a second transistor for receiving an input of inversed weight data from a second node corresponding to an inversed stored value of the ternary memory cell, and a third transistor for receiving an input of an activation signal transmitted via the activation line, wherein when the ternary memory cell stores the weight value of −1, the weight data of the first node is 0 and the inversed weight data of the second node is 2, when the ternary memory cell stores the weight value of 0, the weight data of the first node and the inversed weight data of the second node are 1, and when the ternary memory cell stores the weight value of +1, the weight data of the first node is 2 and the inversed weight data of the second node is 0.

8. The memory cell of claim 7, wherein the first transistor is connected to the first node, the second transistor, and a first operation line, the second transistor is connected to the second node, the first transistor, and a second operation line, and the third transistor is connected to a third node that is a junction of the first transistor and the second transistor, and to the activation line.

9. The memory cell of claim 8, wherein the weight cell is configured to:

receive the weight data and the inversed weight data from the ternary memory cell;

receive the activation signal to activate the weight cell via the activation line; and block at least one of a first current path along the first operation line and the first transistor or a second current path along the second operation line and the second transistor, on a basis of the weight data and the inversed weight data.

10. The memory cell of claim 8, wherein the plurality of memory cells are connected in parallel between the first operation line and the second operation line, and a multiply and accumulate (MAC) operation is performed on a basis of a difference between a voltage applied to the first operation line and a voltage applied to the second operation line.

* * * * *